United States Patent [19]

Brown

[11] 4,324,951
[45] Apr. 13, 1982

[54] ACOUSTIC COUPLING SYSTEM

[76] Inventor: Bruce J. Brown, 4801 Kenmore Ave., #1022, Alexandria, Va. 22304

[21] Appl. No.: 144,552

[22] Filed: Apr. 28, 1980

[51] Int. Cl.³ .............................................. H04H 1/02
[52] U.S. Cl. .................................... 179/1 B; 179/1 C
[58] Field of Search ........... 179/1 B, 1 A, 1 R, 1 AT, 179/1 ST, 1 VE, 1 G, 1 C, 2 C, 182 R; 181/129-135

[56] References Cited

U.S. PATENT DOCUMENTS

| 3,029,307 | 4/1962 | Baxt | 179/1 AT |
| 3,156,771 | 11/1964 | Vaughn | 179/1 C |
| 3,247,324 | 4/1966 | Cefaly et al. | 179/1 ST |
| 3,382,439 | 5/1968 | Frihart | 179/1 VE |
| 3,934,674 | 1/1976 | Shore et al. | 181/135 |
| 3,989,895 | 11/1976 | O'Daniel, Sr. | 179/1 ST |

*Primary Examiner*—John H. Wolff
*Assistant Examiner*—J. A. Popek
*Attorney, Agent, or Firm*—Wigman & Cohen

[57] ABSTRACT

An acoustic coupling system for use with an audio entertainment installation aboard a commercial transportation vehicle, such as a commercial passenger aircraft, is disclosed. The system includes a plug-in terminal for acoustically coupling a pair of earphone transducers to the conventional acoustic piping outlets located at a passenger seat. A small, pocket-size housing encloses an amplifier connected to the summed outputs of the transducers. The amplifier output is variable for volume control and may be fed either to a small speaker also mounted in the housing or to a headphone set so that a passenger may listen to the audio entertainment without the need to use the acoustic headset normally provided by the commercial carrier. An alternate embodiment of the acoustic coupling system of the invention provides for two-channel stereophonic listening.

10 Claims, 3 Drawing Figures

ACOUSTIC COUPLING SYSTEM

BACKGROUND OF THE INVENTION

The present invention relates to a portable audio coupling system for use with a video and audio entertainment system of the type installed aboard commercial transportation vehicles, such as aircraft, railway trains, buses and the like, for transmitting monaural or stereophonic sound entertainment to a passenger/listener.

A search of the prior art failed to uncover any prior art reference which discloses the audio coupling system of the present invention. A number of prior art patents were uncovered which disclose audio systems and accessories, such as acoustic headsets for use with entertainment systems of the aforementioned type. The following is a listing of the prior art patents uncovered during the search: U.S. Pat. Nos. 3,217,831; 3,382,439; 3,385,930; 3,463,886; 3,539,724; 3,830,334; 3,934,674; 3,993,161; 4,011,925; 4,149,610.

Most transcontinental and intercontinental commercial aircraft today, as well as some commercial long-distance ground transportation vehicles, are provided with an on-board audio and video system for providing entertainment to passengers during trips of extended duration. Typically, such entertainment systems have a plurality of audio channels by means of which a variety of sound entertainment, in the form of music, radio, movie sound track and the like, is piped from a central source to dual acoustic pipe outlets located adjacent each passenger position. U.S. Pat. Nos. 3,382,439 and 3,463,886 are generally descriptive of such systems.

For a specified charge, passengers may elect to purchase or rent an acoustic headset of the type disclosed in the aforementioned U.S. Pat. Nos. 3,934,674; 3,993,161; 4,011,925; and 4,149,610. Such acoustic headsets are provided with a dual plug-in terminal for acoustically coupling with the dual channel acoustic pipe outlet at any of the passenger positions.

One of the most notable disadvantages of the aforesaid conventional acoustic headsets, particularly on very long-distance trips, is that the earpieces cause substantial discomfort to the passenger/listener by undesirably pressing against his or her ears. This physical discomfort has been characterized or termed as "plastic fatigue" because the earpieces of such acoustic headsets are generally formed of a synthetic plastic material which must necessarily bear against the ears if one is to take advantage of the sound entertainment. For passengers who frequently travel aboard vehicles having a sound entertainment system of the type described above, this problem is particularly acute and, in many cases, discourages them from taking advantage of the video and audio entertainment offered by the commercial carrier.

Heretofore, those seeking a solution to the foregoing problems have sought to minimize passenger discomfort in several ways, among them: (1) designing the earpiece in a shape which conforms as closely as possible to the shape of the human ear; (2) providing very soft and compliant earpieces or covering for the earpiece; (3) minimizing the overall weight of the headset; and (4) providing a highly resilient earpiece frame or means for adjusting the distance between the earpieces to permit each passenger to attempt to minimize the force of the earpieces pressing against his ears. U.S. Pat. Nos. 3,382,439; 3,934,674; 4,011,925; and 4,149,610, listed above, are typical of the prior art approaches to a solution for this problem.

Despite the foregoing efforts to solve the "plastic fatigue" problem, ear discomfort still remains a significant disadvantage for many passengers. In some cases, the passenger simply cannot tolerate the presence of any type of earpiece pressed in or against his or her ear. Undoubtedly, there are other reasons which discourage passengers from using the conventionally available headsets.

SUMMARY AND OBJECTS OF THE INVENTION

In view of the foregoing limitations and shortcomings of the prior art devices and solutions, as well as other disadvantages not specifically mentioned herein, it should be apparent that there still exists a need in the art for a solution to the "plastic fatigue" problem which will enable every passenger who so desires to take advantage of the video and audio entertainment systems aboard commercial transportation vehicles.

It is, therefore, a primary objective of this invention to fulfill this need by providing a portable, pocket-size acoustic coupling system which may be carried by the passenger on board such a vehicle and which is provided with means for coupling to the acoustic pipe outlets at a passenger position for transmitting the sound to an audio system including a small speaker means carried on the person of the passenger.

More particularly, it is an object of this invention to provide an acoustic coupling system which includes acoustic pipe members for coupling to the dual acoustic pipe outlets at a passenger position, the acoustic pipe members each being coupled to a respective transducer for converting the acoustic signal to an electrical signal which is transmitted to amplifying means and thence to at least one audio speaker or to other audio output means, such as conventional stereophonic headphones.

It is another object of this invention to provide a simple, inexpensive and convenient alternative to the use of a conventional acoustic headset for listening to the sound entertainment system aboard a commercial transportation vehicle.

Yet another object of this invention is to provide an acoustic coupling system for use by a passenger with the sound entertainment installation aboard a commercial transportation vehicle, which system completely eliminates the problem of ear discomfort while, at the same time, minimizes the possibility of distracting or disturbing other passengers.

Briefly described, the aforementioned objects are accomplished according to the present invention by providing an acoustic coupling system which includes a plug-in acoustic pipe terminal suitable for insertion into the conventional acoustic pipe outlets at a passenger position of the afore-described sound entertainment system. The plug-in terminal has a pair of acoustic pipes or sound tubes of a relatively short length extending therefrom. Each sound tube is directly acoustically coupled to a small transducer which converts the acoustic signal into an electrical output signal. The outputs of the small transducers are summed together and fed via an impedance matching transformer to an amplifier which may be selectively connected to either a small audio speaker or to an output receptacle for stereophonic headphones, for example, headphones of the cup-type having rigid ear enclosures or cups with compliant cushions adapted to surround the ear.

In an alternate embodiment, the output of each small transducer is fed to a separate amplifier circuit and speaker. According to this embodiment, the amplifier outputs are also capable of selective connection to a single output receptacle for receiving stereophonic headphones which may be of the aforementioned cup-type.

The impedance matching transformer(s), amplifier(s), audio speaker(s) and headphone receptacle are all advantageously mounted in a small housing or chassis of a size suitable for carrying in a breast pocket, purse, handbag, briefcase or the like. The transducers are electrically connected to the amplifier circuits in the housing by means of small flexible wires, preferably of 2-3 feet in length.

From the foregoing brief description, it is apparent that a passenger/listener having the audio coupling system of the present invention may elect to listen to the sound entertainment system abroad a commercial transportation vehicle by means of the audio speaker(s) provided in the housing or by means of comfortable stereophonic headphones that he or she may choose to bring aboard the vehicle. Accordingly, there is no need to use the much less comfortable acoustic headsets provided by the transportation carrier.

With these and other objects, advantages and features of the invention that may become hereinafter apparent, the nature of the invention may be more clearly understood by reference to the following detailed description of the invention, the appended claims and to the several views illustrated in the attached drawings, wherein:

DETAILED DESCRIPTION OF A PREFERRED EMBODIMENT

Figure 1:
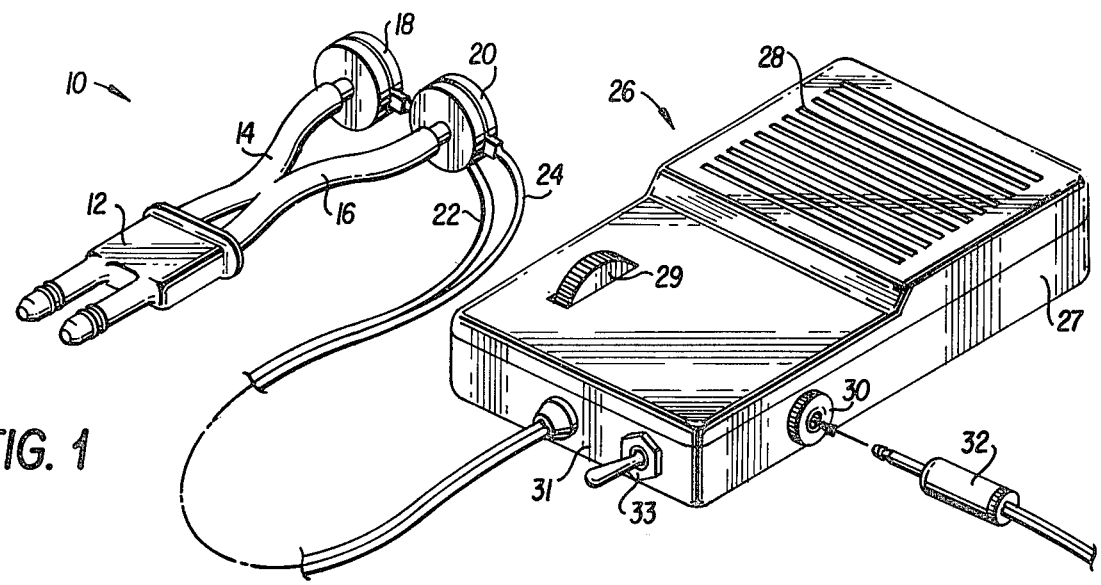
FIG. 1 is a perspective view of the acoustic coupling system according to the present invention.

Referring now to the drawing, the acoustic coupling system of the present invention is illustrated perspectively in FIG. 1 and is designated generally by reference numeral 10. System 10 comprises a plug-in terminal 12 adapted to be inserted into a two-channel stereophonic sound outlet conventionally provided at each passenger seat or position aboard commercial transportation vehicles, especially aircraft vehicles. Acoustic terminal 12 may be of the type shown, for example, in U.S. Pat. No. 3,934,674.

A pair of flexible acoustic pipes 14, 16 are connected at their ends to a respective channel of the terminal 12 and may be formed integrally therewith. Inserted into the other ends of the pipes 14, 16 are transducers 18, 20 which convert the acoustic signal passing from the sound entertainment system aboard the vehicle to the outlet at the passenger position and through the terminal 12 and pipes 14, 16 into an electrical signal. The transducers 18, 20 are small earphones used as microphones which are acoustically and mechanically coupled to the ends of pipes 14, 16. One earphone found particularly suitable for use with this invention is available from Lafayette Radio Company under the designation Stock No. 99A 254 88. That particular earphone is especially adapted for use inasmuch as it has an input tube which is dimensionally compatible with the acoustic pipes of conventional acoustic headsets presently in use.

The outputs of the transducers 18, 20 are electrically connected by small, flexible wires 22, 24 to a battery-powered electrical circuit mounted within the housing or chassis 26. The electrical circuit will be described in greater detail hereinafter in connection with FIGS. 2 and 3. Housing 26 is preferably of a size which may be accommodated in a shirt or breast pocket of a passenger or in a small purse or handbag which may be carried by the passenger aboard the vehicle.

A suitable audio speaker opening or perforate area 28 is provided in one wall 25 of the housing 26 and an outlet receptacle or jack 30 is provided in a side wall 27 of the housing 26 for receiving a headphone plug 32 as more fully described hereinafter. Also disposed in the housing is a volume control which is operable by means of a thumbwheel 29 extending partly through wall 25. A toggle switch 33 is mounted in housing end wall 31 for connecting and disconnecting a power source, such as a dry cell battery, to the electrical circuit in the housing 26.

Figure 2:
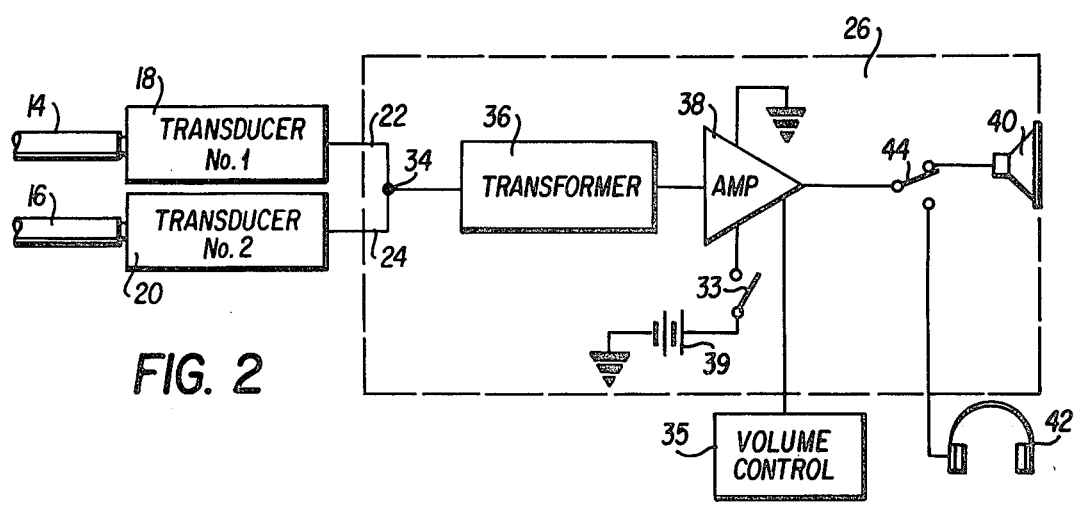
FIG. 2 is a schematic diagram of a first embodiment of the acoustic coupling system of the invention.

Referring now to the schematic diagram shown in FIG. 2 of the drawing, the electrical circuit of a first embodiment of the invention is shown within the dashed lines representing the housing 26. The circuit includes a summing point 34 wherein the outputs of the transducers 18, 20 are summed and fed to an 8 ohm to 1000 ohm impedance matching transformer 36. Transformer 36 is of conventional design and may be of a type available from Radio Shack under the designation Stock No. 273-1380.

The output of transformer 36 is coupled to the input of an amplifier 38, the output of which may be connected selectively to a small speaker 40 or headphones 42 by a switch means 44. The amplifier 38 and speaker 40 are preferably powered by a dry cell battery 39 and may comprise a speaker-amplifier combination available from Radio Shack under the designation Stock No. 277-1008. The function of switch 44 is preferably provided by means of the receptacle or jack 30 (FIG. 1) which opens the circuit to the speaker 40 whenever the headphone plug 32 is inserted in the jack 30 and connects the headphones 42 in circuit in a well-known and, therefore, not particularly illustrated manner. A volume control 35 is provided for varying the amplifier output signal.

It will be understood that the embodiment of FIG. 2 provides only monaural sound in view of the summing at point 34 of the outputs of transducers 18, 20 and the single amplifier-speaker combination. It is also within the scope of the invention according to the FIG. 2 embodiment to acoustically sum the dual channel outputs by connecting the outputs of the pipes 14, 16 to a common pipe which is, in turn, mechanically and acoustically coupled to a single transducer 18 or 20 and transformer 36.

Figure 3:
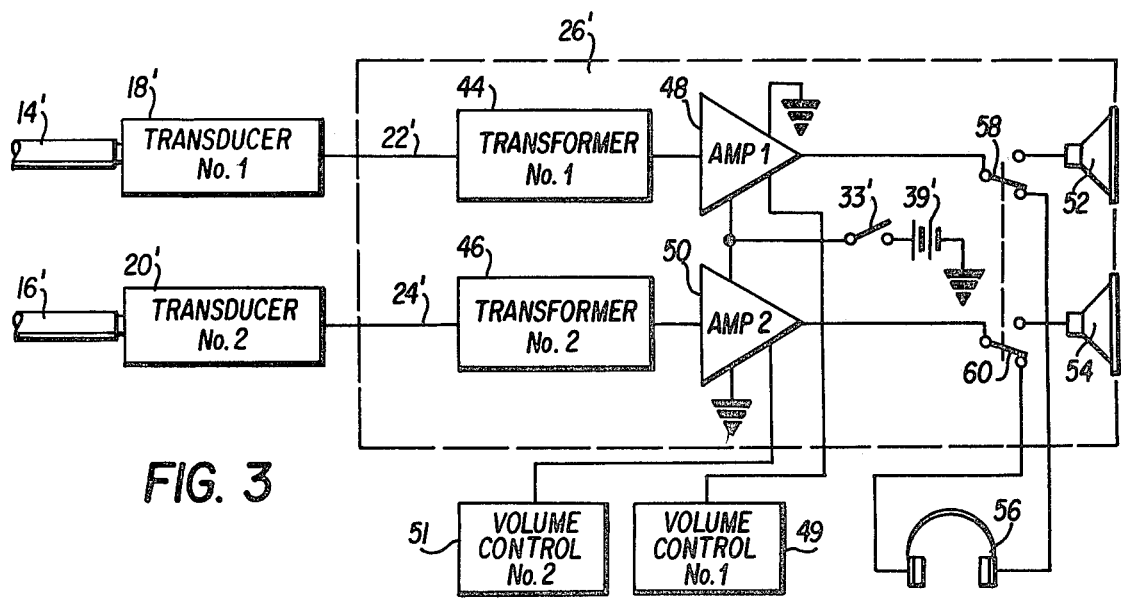
FIG. 3 is a schematic diagram of a second or alternate embodiment of the acoustic coupling system of the present invention.

FIG. 3 illustrates an alternate embodiment of the acoustic coupling system of the invention which provides a stereophonic audio output. Like parts are identified in FIG. 3 with corresponding primed reference numerals used in FIG. 2. In the case of the FIG. 3 embodiment, the outputs of the transducers 18', 20' transmitted by wires 22' and 24' are not summed but are fed to respective impedance matching transformers 44, 46, amplifiers 48, 50 and separate speakers 52, 54, the latter being mounted in a wall of the housing 26'.

Stereophonic headphones 56 are selectively connected to respective audio channels of the electrical circuit at the outputs of amplifiers 48, 50 by means of switches 58, 60 such that the sound received at the headphones is stereophonic. Switches 58, 60 are preferably operated in the same manner as switch 44 of the FIG. 2 embodiment. Each amplifier 48, 50 is also provided with an independent volume control means 49, 51, respectively.

Use of the acoustic coupling system of the present invention is particularly advantageous in numerous situations which commonly arises aboard commercial vehicles with sound entertainment systems and where the conventional acoustic headset would be of little or no practical use. For example, only part of a stereophonic acoustic signal from the dual channel acoustic output at a passenger position could be heard by passengers who are partly or completely deaf in one ear. On the other hand, with the invention, both channels are fed to a speaker or earphone (FIG. 2) or speakers (FIG. 3) which may be located on the hearing side of the passenger.

Moreover, for passengers who are partly deaf in both ears or "hard of hearing" and who may wear a hearing aid device, the additional signal amplification provided by the present invention together with the normal volume control at the passenger position will enable more hard of hearing passengers to take advantage of the sound entertainment system. Of course, for such hard of hearing passengers, the embodiments of FIGS. 2 and 3 employing the headphones 42, 56 are most appropriate to avoid disturbing other passengers.

When two or more passengers in adjacent seats wish to listen to the same audio channel of the sound entertainment system, the present invention provides a convenient means by which such passengers or group of passengers can all listen to the entertainment without the necessity of wearing acoustic headsets. Thus, the volume controls provided for the amplifiers of the embodiments of FIGS. 2 and 3, permit the passenger to vary the audio speaker volume to an appropriate level for either individual or group listening.

The present invention is also useful in situations where, for example, passengers wish to carry on a conversation while, at the same time, desire to listen to soft, relaxing music. With the conventional acoustic headsets, it is virtually impossible to listen to the sound entertainment and simultaneously carry on a conversation, as would be possible with the FIG. 2 and FIG. 3 embodiments using the single and dual speakers, respectively. Those embodiments are also advantageous when, for example, a passenger is addressed by a stewardess. Frequently, to get the attention of a passenger wearing the conventional acoustic headset, it is necessary for the stewardess to touch or otherwise make physical contact with such passenger. That is, of course, unnecessarily time-consuming for the stewardess and is entirely eliminated by the present invention.

From the foregoing, it should be apparent that the acoustic coupling system of the present invention is a simple, inexpensive and remarkably versatile alternative to the conventional acoustic headset heretofore provided aboard commercial transportation vehicles for listening to a sound entertainment system.

Although only preferred embodiments are specifically illustrated and described herein, it will be appreciated that many modifications and variations of the present invention are possible in light of the above teachings and within the purview of the appended claims without departing from the spirit and intended scope of the invention.

What I claim is:

1. In an audio entertainment system for a commercial vehicle, said system including acoustic piping means for transmitting a first acoustic signal from an audio source to at least one passenger position, said passenger position having an acoustic signal outlet means for connection normally with acoustic headset means for insertion in the ears of a passenger for listening to said first acoustic signal, the improvement comprising audio system means for connection with said acoustic signal outlet means for generating a second acoustic signal audible to the passenger at said passenger position so that the use of said acoustic headset means is unnecessary, said audio system means comprising acoustic coupling means for receiving said first acoustic signal, transducer means connected to said acoustic coupling means for converting said first acoustic signal into an electrical signal, amplifier means for amplifying said electrical signal, and means connected to said amplifier means for receiving said amplified electrical signal and for converting said amplifier electrical signal into said second audible acoustic signal.

2. The improvement according to claim 1, wherein said acoustic coupling means comprises an acoustic plug-in terminal, said transducer means being acoustically coupled to said plug-in terminal.

3. The improvement according to claim 2, wherein said acoustic plug-in terminal has two channels and a length of flexible acoustic pipe mechanically and acoustically connected between each channel of said terminal and a respective transducer.

4. The improvement according to claim 2, wherein said acoustic outlet means comprises a pair of outlet connections, said acoustic plug-in terminal including two acoustic channels, and an earphone transducer connected to each of said channels.

5. The improvement according to claim 4, wherein said amplifying means comprises a pair of amplifiers, each having an input and an output, said transducers being connected to the input of a respective amplifier, the outputs of said amplifiers being connected to said means for receiving and converting said amplified electrical signal.

6. The improvement according to claim 5, wherein said means for receiving and converting said amplified electrical signal comprises at least one audio speaker and stereophonic headphones and further includes means for selectively connecting the outputs of said amplifiers to said speaker or said headphones.

7. The improvement according to claim 5, including means for controlling the output of said amplifiers independently of each other.

8. The improvement according to claim 1, wherein said amplifying means comprises an amplifier having an input and output, said means for receiving and converting said amplified electrical signal comprising an audio speaker and audio headphones and further comprising means for selectively connecting the output of said amplifier to said speaker or said headphones.

9. The improvement according to claim 8, wherein said acoustic coupling means comprises an acoustic plug-in terminal having two acoustic pipe channels, said transducer means comprising a transducer acoustically coupled to each of said acoustic pipe channels, said transducers each having an output and means for summing the outputs of said transducers and transmitting the summed output to the input of said amplifier.

10. The improvement according to claim 1, wherein at least a portion of said audio system means is mounted in a portable, pocket-size housing adapted to be placed in a pocket of a passenger.

* * * * *